US008242479B2

(12) United States Patent
Kawashima et al.

(10) Patent No.: US 8,242,479 B2
(45) Date of Patent: Aug. 14, 2012

(54) NONVOLATILE MEMORY APPARATUS AND MANUFACTURING METHOD THEREOF

(75) Inventors: Yoshio Kawashima, Osaka (JP); Takumi Mikawa, Shiga (JP); Ryoko Miyanaga, Nara (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 12/742,841

(22) PCT Filed: Nov. 14, 2008

(86) PCT No.: PCT/JP2008/003325
§ 371 (c)(1),
(2), (4) Date: May 13, 2010

(87) PCT Pub. No.: WO2009/063645
PCT Pub. Date: May 22, 2009

(65) Prior Publication Data
US 2010/0264392 A1 Oct. 21, 2010

(30) Foreign Application Priority Data
Nov. 15, 2007 (JP) .................................. 2007-296510

(51) Int. Cl.
H01L 29/02 (2006.01)
(52) U.S. Cl. .............. 257/2; 257/4; 257/5; 257/E21.002
(58) Field of Classification Search .................. None
See application file for complete search history.

(56) References Cited

U.S. PATENT DOCUMENTS 5,994,757 A 11/1999 Ichikawa et al.
6,753,561 B1 6/2004 Rinerson et al.
2003/0183849 A1 10/2003 Fricke et al.
2003/0185034 A1 10/2003 Fricke et al.
2003/0186468 A1 10/2003 Lazaroff et al.
2004/0141351 A1 7/2004 Fricke et al.
2004/0145008 A1 7/2004 Fricke et al.
2006/0003263 A1 1/2006 Chang
2006/0262627 A1 11/2006 Fricke et al.
2008/0130352 A1* 6/2008 Scheuerlein .................. 365/163

(Continued)

FOREIGN PATENT DOCUMENTS

JP 3-048820 3/1991

(Continued)

Primary Examiner — Ha Tran T Nguyen
Assistant Examiner — Vongsavanh Sengdara
(74) Attorney, Agent, or Firm — McDermott Will & Emery LLP

(57) ABSTRACT

A nonvolatile memory device includes via holes (12) formed at cross sections where first wires (11) cross second wires (14), respectively, and current control elements (13) each including a current control layer (13b), a first electrode layer (13a) and a second electrode layer (13c) such that the current control layer (13b) is sandwiched between the first electrode layer (13a) and the second electrode layer (13c), in which resistance variable elements (15) are provided inside the via holes (12), respectively, the first electrode layer (13a) is disposed so as to cover the via hole (12), the current control layer (13b) is disposed so as to cover the first electrode layer (13a), the second electrode layer (13c) is disposed on the current control layer (13b), a wire layer (14a) of the second wire is disposed on the second electrode layer (13c), and the second wires (14) each includes the current control layer (13b), the second electrode layer (13c) and the wire layer (14a) of the second wire.

11 Claims, 7 Drawing Sheets

U.S. PATENT DOCUMENTS

| | | | |
|---|---|---|---|
| 2009/0014710 A1* | 1/2009 | Kawashima et al. | 257/5 |
| 2009/0052225 A1* | 2/2009 | Morimoto | 365/148 |
| 2009/0174519 A1* | 7/2009 | Mikawa et al. | 338/20 |
| 2009/0200640 A1 | 8/2009 | Hosoi et al. | |
| 2011/0310662 A1* | 12/2011 | Scheuerlein | 365/163 |

FOREIGN PATENT DOCUMENTS

| | | |
|---|---|---|
| JP | 07-074372 | 3/1995 |
| JP | 07-263647 | 10/1995 |
| JP | 2004-006777 | 1/2004 |
| JP | 2005-518665 | 6/2005 |
| JP | 2006-019686 | 1/2006 |
| JP | 2006-203098 | 8/2006 |
| JP | 2007-294998 | 11/2007 |
| WO | WO 03/071614 A2 | 8/2003 |
| WO | WO 2004/084228 A1 | 9/2004 |
| WO | WO 2005/101539 A1 | 10/2005 |
| WO | WO 2007/102483 A1 | 9/2007 |
| WO | WO 2007/116749 A1 | 10/2007 |

* cited by examiner

NONVOLATILE MEMORY APPARATUS AND MANUFACTURING METHOD THEREOF

RELATED APPLICATIONS

This application is the U.S. National Phase under 35 U.S.C. §371 of International Application No. PCT/JP2008/003325, filed on Nov. 14, 2008, which in turn claims the benefit of Japanese Application No. 2007-296510, filed on Nov. 15, 2007, the disclosures of which Applications are incorporated by reference herein.

TECHNICAL FIELD

The present invention relates to a nonvolatile memory device for storing data using a material which reversibly switches a resistance value in response to electric pulses applied thereto, and a manufacturing method thereof.

BACKGROUND ART

In recent years, with advancement of digital technologies of electronic hardware, semiconductor memory devices which have large capacities and are nonvolatile have been vigorously developed to store data of music, image, information, etc. For example, a nonvolatile memory device incorporating ferroelectric as a capacitive element is used in many fields. In contrast to the nonvolatile memory device incorporating the ferroelectric capacitor, a nonvolatile memory device incorporating magnetoresistive effect memory element, for example, a TMR element, a nonvolatile memory device (hereinafter referred to as ReRAM) incorporating a resistance variable memory element (resistance variable element) which switches resistance values in response to electric pulses applied thereto and retains the switched states, and so on have attracted an attention, because they have a high compatibility with a standard semiconductor process and enable miniaturization.

An exemplary structure for achieving high-dense integration in the nonvolatile memory device is a cross point structure (see Patent document 1). In this nonvolatile memory device having the cross point structure, plural memory elements respectively including resistance variable elements are arranged in array and these resistance variable elements are provided inside via holes at cross sections of plural first wires and plural second wires extending in parallel with each other in a direction crossing the first wires. To selectively activate a specified memory element selected from among the plural memory elements arranged in array, elements (non-linear elements or current control elements) having non-linear current and voltage characteristics are respectively placed in series with the resistance variable elements. The Patent document 1 discloses that bidirectional current control is achieved by using MIM diodes as the non-linear elements.

There is also known a configuration in which a memory element (resistance variable element) and a control element (current control element) are arranged adjacent each other horizontally instead of vertically as disclosed in the Patent document 1 and the cross-sectional area of the memory element is made smaller than the cross-sectional area of the control element, thereby enabling the memory element to switch its state at a lower energy level than the control element (e.g., Patent document 2). Patent document 2 intends to provide an economical and large-capacity memory structure using such a configuration.

Patent document 1: U.S. Pat. No. 6,753,561 Specification
Patent document 2: Japanese Laid-Open Patent Application Publication No. 2004-6777

DISCLOSURE OF THE INVENTION

Problems to be Solved by the Invention

As disclosed in Patent document 1, when the MIM diode is used as the current control element, it is typically necessary to use an insulating film which is as thin as about several nm to operate the memory element with a low voltage. For this reason, if a high current density is required to rewrite data in the resistance variable element, there is a chance that insulation breakdown occurs (the insulating film loses its insulating property and the current control element loses its function). As miniaturization further progresses from now in the conventional structure in which the resistance variable element and the current control element are placed in series inside the via hole, the current which can be flowed through the resistance variable element via the current control element decreases, making it difficult to rewrite data in the resistance variable element.

As disclosed in Patent document 2, the resistance variable element is capable of switching its states at a lower energy level than the current control element by making the cross-sectional area of the current control element larger than that of the resistance variable element. However, the structure is complex and a structure of the memory element which is compatible with a process adapted for miniaturization which mainly uses a process rule smaller than 100 nm is not disclosed.

To solve these problems, therefore, there is a need for a nonvolatile memory element having a structure which is compatible with a process adapted for miniaturization at preset and in the future and is suitable for a mass production process, and incorporating at a proper position a current control element capable of stably supplying a necessary and sufficient current to a miniaturized resistance variable element.

The present invention is directed to solving the above-described problems, and an object of the present invention is to provide a nonvolatile memory device having a miniaturized cross point structure, which is compatible with a mass production process, and incorporates a current control element optimally connected to a resistance variable element to supply a necessary and sufficiently high rewrite current to the resistance variable element, and a manufacturing method thereof.

Means for Solving the Problem

To achieve aforesaid object, a nonvolatile memory device of the present invention, comprises a substrate; plural first wires provided on the substrate so as to extend in parallel with each other in a first direction; an interlayer insulating layer provided over the substrate and the first wires; via holes penetrating the first interlayer insulating layer on the first wires; resistance variable layers which are provided under upper openings of the via holes, respectively, and are electrically connected to the first wires, respectively; first electrode layers which are electrically connected to the resistance variable layers, respectively such that each of the first electrode layers covers an entire upper opening of associated one of the via holes and protrudes outward over entire peripheries of the upper opening of the via holes; and plural second wires provided so as to extend in parallel with each other in a second direction crossing the first direction when viewed from a thickness direction of the interlayer insulating layer such that each of the plural second wires covers an upper surface and side surfaces of associated one of the first electrode layers; wherein each of the second wires includes a current control layer provided so as to cover an upper surface and side surfaces of the first electrode layer; and a second electrode layer provided so as to cover an upper surface of the current control layer and a portion of side surfaces of the current control layer, the portion covering the side surfaces of the first electrode layer.

In such a configuration, the current control element has a structure in which the current control layer is sandwiched between the first electrode layer and the second electrode layer. The effective area of the current control element is an area (sum of the area of the upper surface of the first electrode layer and a portion of the side surfaces of the first electrode layer which is covered by the current control layer) of the portion of the first electrode layer which is in contact with the current control layer. The effective area of the current control element is larger than the area of the upper opening of the via hole. If the current density in the current control element is equal, the current flowing through the resistance variable element can be made higher. Therefore, a sufficiently high current can be applied to the resistance variable element to write data (switch the resistance states).

To achieve the above described object, a nonvolatile memory device of the present invention comprises a substrate; first wires of a stripe shape which are provided on the substrate; an interlayer insulating layer provided over the first wires; second wires of a stripe shape which are provided so as to three-dimensionally cross the first wires, respectively; plugs provided at cross sections where the first wires cross the second wires, respectively; and current control elements provided on the plugs, respectively and each including a current control layer, a first electrode layer, and a second electrode layer, the current control layer being sandwiched between the first electrode layer and the second electrode layer; wherein the plugs include resistance variable elements, respectively; wherein the first electrode layer is disposed so as to cover associated one of the plugs; wherein the current control layer, the second electrode layer and a wire layer are stacked in this order on the first electrode layer; wherein each of the second wires of the stripe shape has a stack structure including the current control layer, the second electrode layer and the wire layer; and wherein the current control layer is provided so as to cover an upper surface of the first electrode layer and at least a part of side surfaces of the first electrode layer.

A nonvolatile memory device of the present invention comprises a substrate; first wires of a stripe shape which are provided on the substrate; an interlayer insulating layer provided over the first wires; second wires of a stripe shape which are provided so as to three-dimensionally cross the first wires, respectively; plugs provided at cross sections where the first wires cross the second wires, respectively; and current control elements provided on the plugs, respectively and each including a current control layer, a first electrode layer and a second electrode layer, the current control layer being sandwiched between the first electrode layer and the second electrode layer; wherein the plugs include resistance variable elements, respectively; wherein the first electrode layer is disposed so as to cover associated one of the plugs; wherein the current control layer, the second electrode layer and a wire layer are stacked in this order on the first electrode layer; wherein each of the second wires of the stripe shape has a stack structure including the current control layer, the second electrode layer and the wire layer; and wherein the first electrode layer has a width equal to a width of the second wire.

In such a configuration, since the effective area of the current control element is larger than the area of the plug, a higher current can be flowed through the resistance variable element incorporating the conventional current control element which is formed in the plug section. Thus, a necessary and sufficient current can be flowed through the resistance variable element to rewrite data.

The nonvolatile memory device is manufactured in a semiconductor process using the conventional CMOS process, etc, without using special semiconductor processes which are unique to manufacturing of the resistance variable element and to manufacturing of the current control element. Therefore, the nonvolatile memory device can be manufactured with a compatibility with a semiconductor process adapted for further miniaturization.

Moreover, in such a configuration, a necessary and sufficient current can be applied to the resistance variable element incorporating as the current control element a MIM (Metal-Insulator-metal) diode, a MSM (metal-Semiconductor-Metal) diode or a Schottky diode. Therefore, the nonvolatile memory device can be manufactured with a compatibility with the semiconductor process.

The upper electrode and the first electrode layer may be a common electrode.

In such a configuration, the manufacturing steps can be simplified and the cost can be reduced.

A method of manufacturing a nonvolatile memory device of the present invention, comprises the steps of forming first wires of a stripe shape on a substrate; forming an interlayer insulating layer over the substrate and the first wires; forming second wires of a stripe shape such that the second wires three-dimensionally cross the first wires, respectively; forming plugs including resistance variable elements, at cross sections where the first wires cross the second wires, respectively; forming current control elements on the plugs, respectively, the current control elements each including a current control layer, a first electrode layer and a second electrode layer, the current control layer being sandwiched between the first electrode layer and the second electrode layer; wherein the step of forming the first electrode layer includes a step of depositing the first electrode layer on associated one of the plugs and a step of etching the first electrode layer such that the first electrode layer covers the plug and has a larger area than a surface of the plug; and wherein the step of forming the second wires includes a step of sequentially depositing the current control layer, the second electrode layer and a wire layer on the first electrode layer and a step of etching the current control layer, the second electrode layer and the wire layer in a shape of the second wires having a larger width than the first electrode layer.

In such a method, since the effective area of at least the current control element can be made larger than the area of the plug without adding special manufacturing steps, a higher current can be flowed using the conventional current control element, and thus a nonvolatile memory device capable of flowing a necessary and sufficient current through the resistance variable element to rewrite data can be easily manufactured.

A method of manufacturing a nonvolatile memory device of the present invention comprises the steps of: forming first wires of a stripe shape on a substrate; forming an interlayer insulating layer over the substrate and the first wires; forming second wires of a stripe shape such that the second wires three-dimensionally cross the first wires, respectively; forming plugs including resistance variable elements, at cross sections where the first wires cross the second wires, respectively; and forming current control elements on the plugs, respectively, the current control element each including a current control layer, a first electrode layer and a second electrode layer, the current control layer being sandwiched between the first electrode layer and the second electrode layer; wherein the step of forming the first electrode layer includes a step of depositing the first electrode layer on associated one of the plugs and a step of etching the first electrode layer in stripe-shaped wires which width are larger than surfaces of the plugs and extending in the same direction that the first wires extend such that the first electrode layer covers the plugs; and wherein the step of forming the second wires includes a step of sequentially depositing the current control later, the second electrode layer and a wire layer on the first electrode layer, and a step of etching the first electrode layer, the current control layer, the second electrode layer and the wire layer together in a shape of the second wires of the stripe shape. The step of forming the first electrode layer may include a step of depositing the first electrode layer on the plug and at least a part of the interlayer insulating layer and a step of etching the first electrode layer in a shape identical to a shape of the first wires. The step of etching the first electrode layer in the shape identical to the shape of the first wires may be performed using a mask pattern of the first wires.

In such a method, the nonvolatile memory device of the present invention can be manufactured using a semiconductor process adapted for miniaturization which is similar to wiring process steps used in the CMOS process etc, and using a mass production process which is compatible with a process adapted for miniaturization process which mainly uses a process rule smaller than 100 nm.

In such a method, the current control layer is sandwiched between the first electrode layer and the second electrode layer to constitute the current control element. The effective area of the current control element is an area (sum of the area of the upper surface of the first electrode layer and a portion of the side surfaces of the first electrode layer which is covered by the current control layer) of the portion of the first electrode layer which is in contact with the current control layer. Since the effective area of the current control element is larger than the area of the upper end surface of the plug, the current flowed through the resistance variable element can be increased if the current density in the current control element is equal. Therefore, a sufficiently high current can be flowed through the resistance variable element to rewrite data (switch the resistance state).

The above and further objects, features and advantages of the present invention will more fully be apparent from the following detailed description with reference to the accompanying drawings.

Effects of the Invention

In accordance with the nonvolatile memory device of the present invention, a necessary and sufficient current can be attained to rewrite data in a miniaturized resistance variable element, a mass production which is compatible with a process adapted for miniaturization which mainly uses a process rule smaller than 100 nm can be used, and a larger capacity of the nonvolatile memory device can be achieved.

Figure 1:
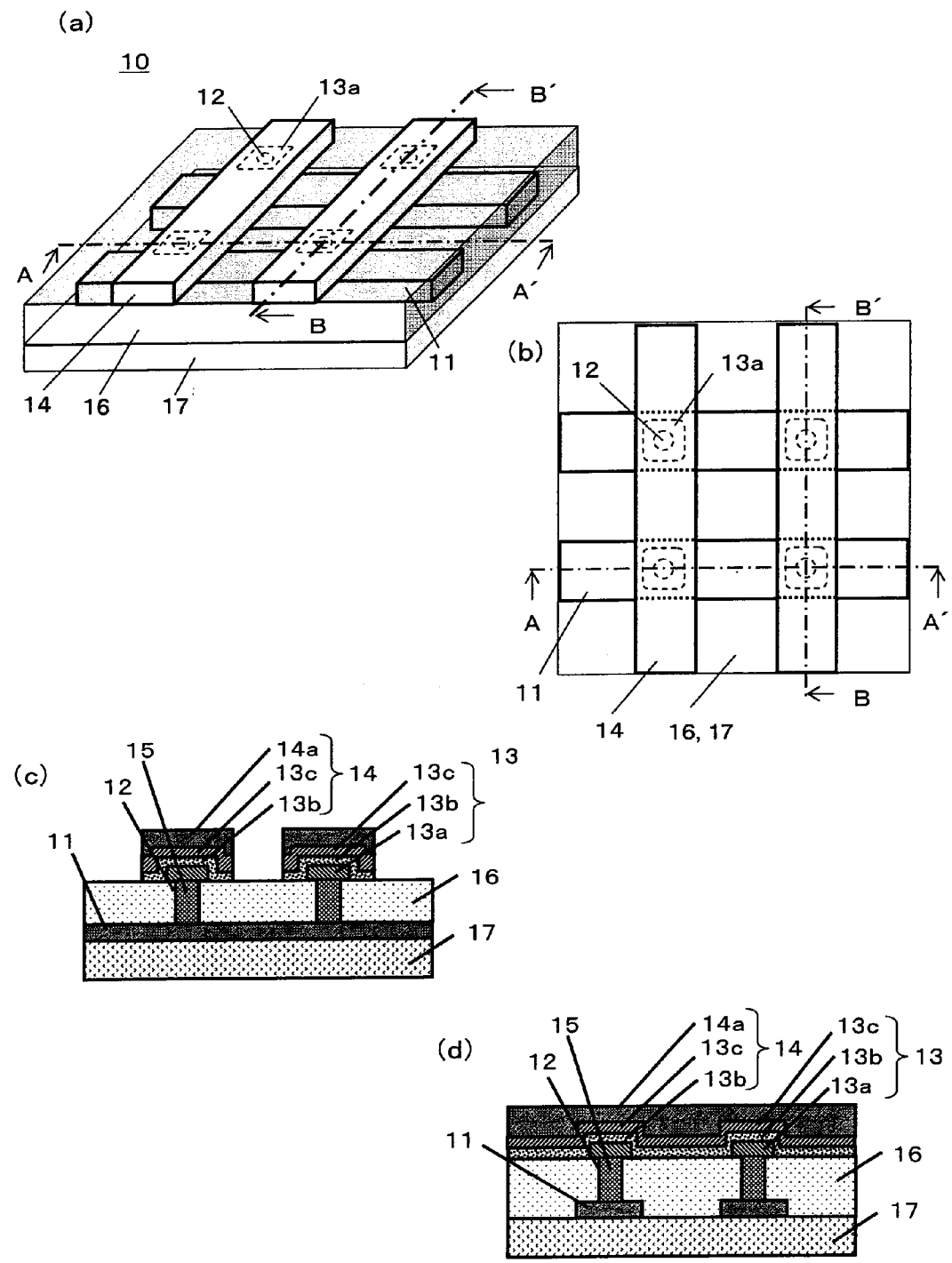
FIG. 1(a) is a perspective view schematically showing a configuration of major constituents of a nonvolatile memory device according to Embodiment 1 of the present invention.
FIG. 1(b) is a plan view schematically showing a configuration of major constituents of the nonvolatile memory device according to Embodiment 1 of the present invention.
FIG. 1(c) is a cross-sectional view taken in the direction of the arrows along line A-A' of FIGS. 1(a) and 1(b)
FIG. 1(d) is a cross-sectional view taken in the direction of the arrows along line B-B' of FIGS. 1(a) and 1(b).

EXPLANATION OF REFERENCE NUMERALS 10, 20, 30 nonvolatile memory devices
11, 21, 31 first wires
12, 22, 32 via holes
13, 23, 33 current control elements
13a, 23a, 33a first electrode layers
13b, 23b, 33b current control layers
13c, 23c, 33c second electrode layers
14, 24 second wires
14a, 24a, 34a wire layers of second wires
15, 25, 35 resistance variable elements (plugs)
16, 26, 36 interlayer insulating layers
17, 27 substrates
35a lower electrode
35b resistance variable layer
35c upper electrode
101 diameter of via hole
102 length of one side of first electrode layer
103 thickness of first electrode layer

BEST MODE FOR CARRYING OUT THE INVENTION

Hereinafter, preferred embodiments of the present invention will be described with reference to the drawings.

The same constituents are designated by the same reference numerals and will not be described repetitively in some cases. The shapes of transistors, memory sections and the like are schematically drawn and the numbers of them are set to ones for easier illustration. As used herein, the resistance variable element refers to a resistance variable memory element which switches resistance values in response to electric pulses applied thereto and retains the switched states, and a current control element refers to an element in which a current flowing therethrough increases non-linearly as the voltage applied to the element increases in magnitude.

Embodiment 1

FIG. 1 is a view schematically showing a configuration of major constituents of a nonvolatile memory device 10 according to Embodiment 1 of the present invention. FIG. 1(a) is a perspective view. FIG. 1(b) is a plan view. FIG. 1(c) is a cross-sectional view taken in the direction of the arrows along line A-A'. FIG. 1(d) is a cross-sectional view taken in the direction of the arrows along line B-B'.

As shown in FIG. 1, the nonvolatile memory device 10 of the present invention includes a substrate 17, first wires 11 of a stripe shape which are provided on the substrate 17, an interlayer insulating layer 16 provided over the first wires 11, second wires 14 of a stripe shape which are provided so as to three-dimensionally cross the first wires 11, respectively, via holes 12 provided at cross sections where the first wires 11 cross the second wires 14, respectively, plugs (plug is a section connecting the first wire 11 to the second wire 14 and includes a resistance variable element 15) disposed at least in the via holes 12, respectively, and current control elements 13 provided on the via holes 12, respectively such that a current control layer 13b is sandwiched between a first electrode layer 13a and a second electrode layer 13c. The first electrode layer 13a is disposed so as to cover the via hole 12, the current control layer 13b is disposed so as to cover the first electrode layer 13a, and the second electrode layer 13c is disposed on the current control layer 13b. A wire layer 14a of the second wire 14 is disposed on the second electrode layer 13c. The second wire 14 consists of the current control layer 13b, the second electrode layer 13c and the wire layer 14a of the second wire.

In greater detail, the nonvolatile memory device 10 of this embodiment includes the substrate 17, plural first wires 11 which are provided on the substrate 17 so as to form a first flat plane parallel to a main surface of the substrate 17, and are respectively arranged to extend in parallel with each other in a first direction, the interlayer insulating layer 16 provided over the substrate 17 and the plural first wires 11 (so as to cover these) such that the upper surface thereof extends in parallel to the main surface of the substrate 17, and plural second wires 14 which are provided on the interlayer insulating layer 16 so as to form a second flat plane parallel to the first flat plane and are arranged in parallel with each other so as to respectively extend in a second direction crossing the first direction (cross at a right angle in the example of FIG. 1) when viewed from the thickness direction. The first wires 11 and the second wires 14 three-dimensionally cross each other, respectively, and the via holes 12 are provided to respectively correspond to the three-dimensional cross points.

As the material of the first wires 11 and the wire layers 14a of the second wires, for example, Al, or Cu may be used. As the material of the first electrode layer 13a and the second electrode layer 13c, for example, TaN, TiN, or W, may be used.

The resistance variable layer 15 may be a resistance variable layer comprising an oxide of transition metal such as Ta. In this case, the resistance variable element has a structure in which the resistance variable layer is sandwiched between the first wire 11 and the first electrode layer 13a. The resistance variable layer is electrically connected to the first wire 11 and to the first electrode layer 13a. The specific example of the configuration of the resistance variable layer 15 will be described later with reference to FIG. 7. The resistance variable layer 15 is a ReRAM element which switches resistance values in response to electric pulses applied thereto. The resistance variable element 15 has two resistance states which are a low-resistance state and a high-resistance state. The polarity of the voltage of the electric pulse (high-resistance state attaining pulse) for switching the resistance variable element from the low-resistance state to the high-resistance state is desirably different from the polarity of the voltage of the electric pulse (low-resistance state attaining pulse) for switching the element from the high-resistance state to the low-resistance state. In other words, the resistance variable element 15 is desirably so-called a bipolar resistance variable element.

The first electrode layer 13a is configured to cover the entire upper opening of the via hole 12 which is a cylindrical void provided in the interlayer insulating layer 16 and protrudes outward over the entire periphery of the upper opening when viewed from a thickness direction. To be specific, the area of the lower surface of the first electrode layer 13a is larger than the area of the upper opening of the via hole 12. The first electrode layers 13a are isolated from each other such that one first electrode layer 13a corresponds to one via hole 12 and are arranged at specified intervals like an island. The resistance variable element 15 (resistance variable layer included in the resistance variable element) is provided inside the via hole 12 (under the upper opening of the via hole 12 and above the lower opening of the via hole 12). With such a configuration, the area (area of the resistance variable layer which is in contact with the electrode: electrode area) of the resistance switching region of the resistance variable element 15 is equal to or smaller than the opening area of the via hole 12.

The first electrode layer 13a has an area of 160 nm×160 nm square and a thickness of 20 nm, for example. The upper opening of the via hole 12 has a diameter of, for example, 80 nm. The first wire 11 and the second wire 14 have a width of, for example 200 nm.

The current control layer 13b completely covers the upper surface (entire of the upper surface) and side surfaces (entire of side surfaces) of the first electrode layer 13a. As the material of the current control layer 13b, for example, SiNx may be used. The current control layer 13b may be a semiconductor or an insulator. When the current control layer 13b is the semiconductor, the current control element 13 is a MSM diode. When the current control layer 13b is the insulator, the current control element 13 is a MIM diode. The thickness of the current control layer 13b is, for example, about 10 nm.

The second electrode layer 13c completely covers the upper surface (entire of the upper surface) and side surfaces (entire of side surfaces) of the current control layer. The thickness of the second electrode layer 13c is, for example, about 30 nm.

In the current control elements 13, only the first electrode layers 13a are isolated from each other such that one first electrode layer 13a corresponds to one current control element. The current control layer 13b and the second electrode layer 13c extend continuously over plural current control elements along the direction in which the second wire 14 extends. The portion (portion covering the first electrode layer 13a) of the current control layer 13b and the second electrode layer 13c, corresponding to each of the first electrode layers 13a arranged like an island, may be regarded as constituting a single current control element.

The wire layer 14a of the second wire is not essential, but the second electrode layer 13c may be used as the wire layer of the second wire. Thus, the electrode and wire which are vertically physically in contact may be a common constituent element (one metal layer may be used as the electrode and the wire) or different constituent elements, depending on the cost, electric conductivity or the like of the material. The configuration in which the electrode of the resistance variable element 15 and other constituent are a common constituent element or different constituent elements will be described later with reference to FIG. 7.

In the nonvolatile memory device 10 shown in FIG. 1, one of the first wire 11 and the second wire 14 operates as a word line and the other operates as a bit line.

Figure 2:
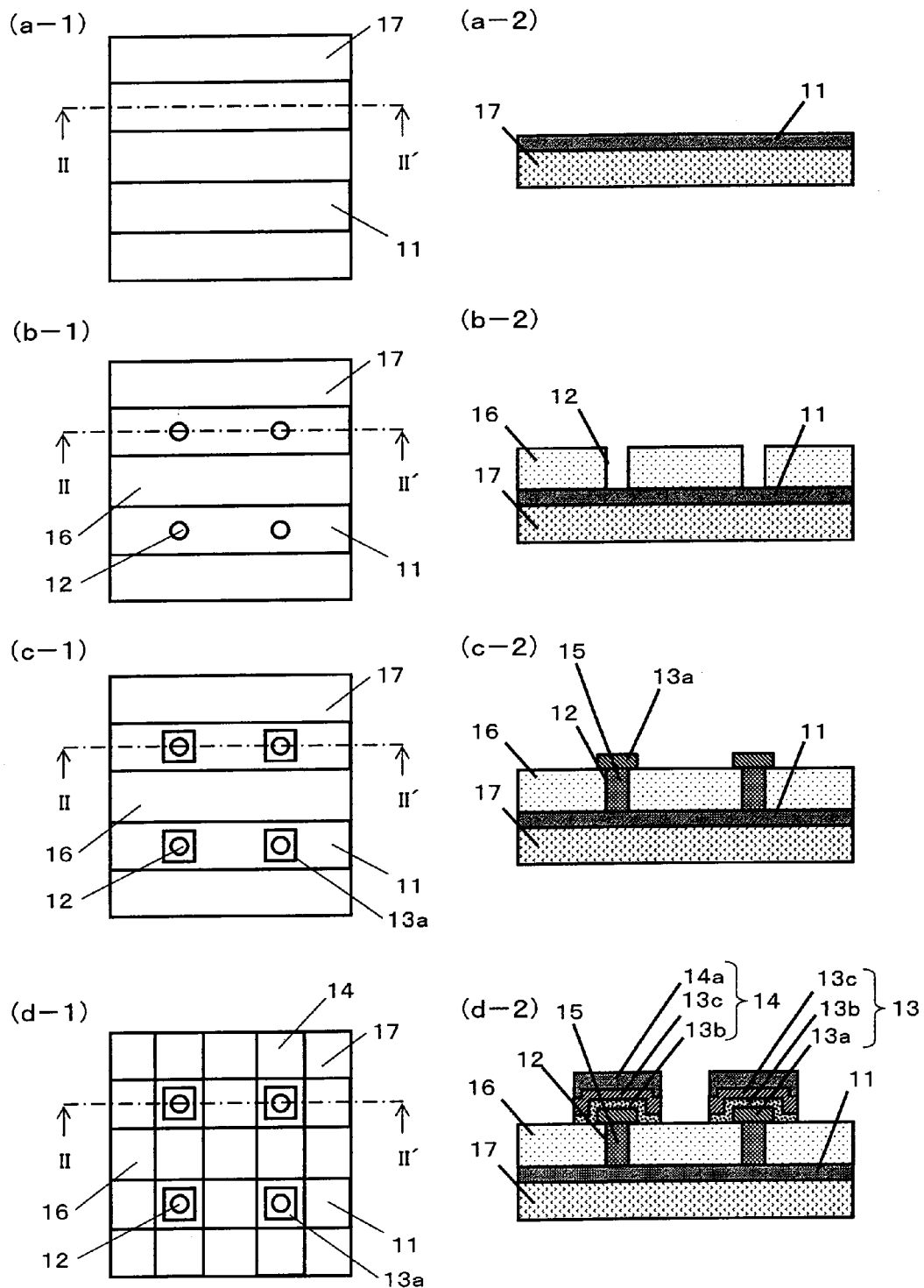
FIG. 2(a-1) is a plan view showing a step of a manufacturing method of the nonvolatile memory device according to Embodiment 1 of the present invention, FIG. 2(a-2) is a cross-sectional view taken in the direction of the arrows along line II-II' of FIG. 2(a-1), FIG. 2(b-1) is a plan view showing a step of the manufacturing method of the nonvolatile memory device according to Embodiment 1 of the present invention, FIG. 2(b-2) is a cross-sectional view taken in the direction of the arrows along line II-II' of FIG. 2(b-1), FIG. 2(c-1) is a plan view showing a step of the manufacturing method of the nonvolatile memory device according to Embodiment 1 of the present invention, FIG. 2(c-2) is a cross-sectional view taken in the direction of the arrows along line II-II' of FIG. 2(c-1), FIG. 2(d-1) is a plan view showing a step of the manufacturing method of the nonvolatile memory device according to Embodiment 1 of the present invention, and FIG. 2(d-2) is a cross-sectional view taken in the direction of the arrows along line II-II' in FIG. 2(d-1).

Subsequently, the specific configuration of the nonvolatile memory device 10 and manufacturing method thereof according to this embodiment will be described specifically with reference to FIG. 2. FIG. 2 is a plan view and cross-sectional view of main steps of the manufacturing method of the nonvolatile memory device 10 of this embodiment. FIG. 2(a-1), FIG. 2(b-1), FIG. 2(c-1), and FIG. 2(d-1) are plan views of major constituents of the nonvolatile memory device 10, and FIG. 2(a-2), FIG. 2(b-2), FIG. 2(c-2), and FIG. 2(d-2) are cross-sectional views taken in the direction of the arrows along line II-II' along the first wire 11. In an actual nonvolatile memory device 10, a number of first wires 11 and a number of second wires 14 are formed and a number of via holes 12 are formed at cross sections where the first electrode wires 11 cross the second wires 14, respectively. In the example shown in FIG. 2, two first wires 11 and two second wires 14 are formed. For easier illustration, a part of the shapes are drawn as enlarged.

Initially, as shown in FIG. 2(a-1) and FIG. 2(a-2), the first wires 11 are formed on the surface of the substrate 17 having an insulating layer at least on a surface thereof (As used herein, the term "formed" means "etched in a predetermined pattern, but may be meant to include "deposited" in the following description). After forming the first wires 11, the interlayer insulating layer 16 is formed over the upper surface of the substrate 17 provided with the first wires 11. Then, as shown in FIG. 2(b-1) and FIG. 2(b-2), the via holes 12 are formed at cross sections where the first wires 11 cross the second wires 14, respectively. The via holes are easily formed in such a manner that, for example, a mask is formed on the upper surface of the interlayer insulating layer 16 except for the regions corresponding to via holes 12, and then the regions corresponding to the via holes are etched away. Then, the resistance variable layer is deposited over the interlayer insulating layer 16 and the first wires 11 exposed by formation of the via holes, thereby forming the resistance variable elements 15 inside the via holes 12, respectively.

After forming the resistance variable elements 15 (plugs), the first electrode layer 13a is deposited over the via holes 12 and the interlayer insulating layer 16. As shown in FIG. 2(c-1) and FIG. 2(c-2), the first electrode layers 13a are formed in a pattern larger than the via holes 12 so as to cover the via holes 12, respectively. The first electrode layers 13a are easily formed in a pattern by pattering using a mask, for example. After forming the first electrode layers 13a as shown in FIG. 2(c-2), the current control layers 13b, the second electrode layers 13c, and the wire layers 14a of the second wires are sequentially deposited. As shown in FIG. 2(d-1) and FIG. 2(d-2), the current control layers 13b, the second electrode layers 13c and the wire layers 14 of the second wires are etched in predetermined patterns, thereby forming the second wires 14.

In this case, the current control layer 13b is formed so as to completely cover the upper surface (entire of the upper surface) and side surfaces (entire of side surfaces) of the first electrode layers 13a. The second electrode layer 13c is formed so as to cover the entire upper surface (the whole upper surface) of the current control layer and an entire portion of the side surfaces of the current control layer 13b, which portion covers the side surfaces of the first electrode layer 13a.

Figure 7:
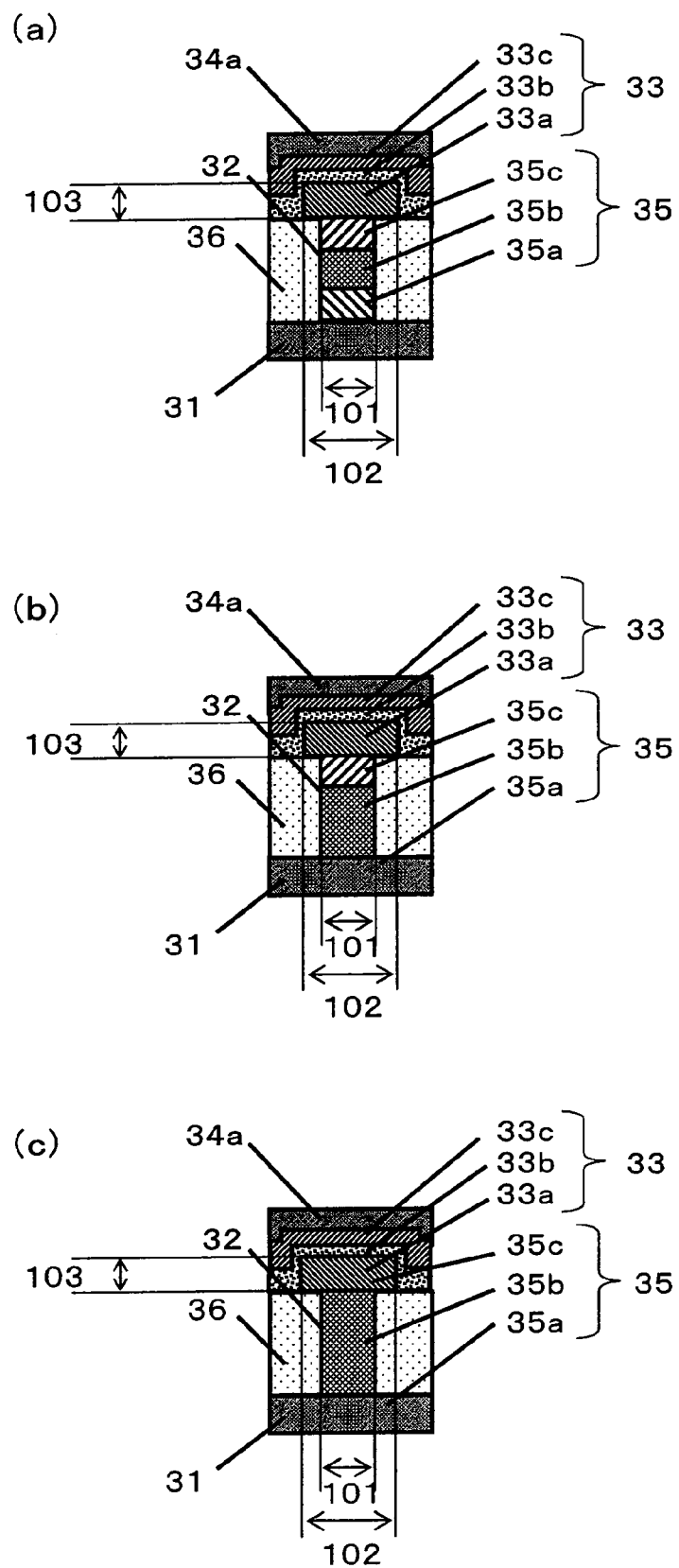
FIG. 7(a) is a cross-sectional view showing an example of a resistance variable element and a current control element in the nonvolatile memory device of the present invention.
FIG. 7(b) is a cross-sectional view showing another example of the resistance variable element and the current control element in the nonvolatile memory device of the present invention.
FIG. 7(c) is a cross-sectional view showing another example of the resistance variable element and the current control element in the nonvolatile memory device of the present invention.

Through the above explained process, the nonvolatile memory device of this embodiment can be manufactured. FIG. 7 shows specific examples of the shapes of the resistance variable element and current control element which are incorporated into the nonvolatile memory device of this embodiment.

FIGS. 7(a), 7(b) and 7(c) are cross-sectional views of specific configurations of the resistance variable element 35 and the current control element 33.

FIG. 7(a) shows the lower electrode 35a, the resistance variable layer 35b, and the upper electrode 35c which are provided inside the via hole 32 to constitute the resistance variable element 35. In this configuration, the area (hereinafter referred to as a first area) of a resistance switching region is the plane area of a portion of the resistance variable layer 35b which is in contact with the lower electrode 35a, or the plane area of a portion of the resistance variable layer 35b which is in contact with the upper electrode 35c. For example, assuming that diameter 101 of the via hole 32 is 80 nm and length 102 of one side of the first electrode layer 33a of a square shape is 160 nm, the area (hereinafter referred to as a second area and area of only the upper surface interface of the first electrode layer 33a and the current control layer 33b which are in contact) of the first electrode layer 33a which is in contact with the current control layer 33b is 0.0256 $\mu m^2$, and the first area is 0.0050 $\mu m^2$. Since the ratio of the second area to the first area is about 5.1, the current control element 33 such as the MIM diode which would be broken down with a current density of 1 mA/$\mu m^2$ can apply a necessary and sufficient write current to the resistance variable element 35, when the write current must be applied to the resistance variable element 35 with a current density of 3 mA/$\mu m^2$. As the current control element, MIM (Metal-Insulator-Metal) diode, MSM (Metal-Semiconductor-Metal) diode or a Schottky diode may be used to apply a necessary and sufficient current to the resistance variable element.

As the material of the lower electrode 35a and the upper electrode 35c, for example, Pt, TaN, or Ir may be used.

In view of the area of the side surfaces, when the thickness of the first electrode layer 33a is 20 nm, the second area is 0.0384 $\mu m^2$. The ratio of the second area to the first area (second area/first area) is about 7.6. From this, it should be understood that the current control element of an identical upper limit of current density can apply a higher current to the resistance variable element disposed in the plug section.

The upper limit of the current density with which current breakdown does not occur in the current control element (current control element does not lose a function as a current steering element) is determined by the materials of the electrodes or insulator/semiconductor, the structure including the thickness of the insulating layer/semiconductor layer, etc.

As can be clearly seen from the above, the nonvolatile memory device of this embodiment is capable of attaining a necessary and sufficient current to write data in a miniaturized resistance variable element, and can use a mass production process which is compatible with a process adapted for miniaturization which mainly uses a process rule smaller than 100 nm.

In an alternative example of the configuration of FIG. 7(a), the lower electrode 35a of the resistance variable element 35 may also be used as the first wire 31, as shown in FIG. 7(b). In this case, the advantage similar to that described with reference to FIG. 7(a) is achieved.

As described above, the via holes are formed after the interlayer insulating layer is deposited, and the resistance variable layers (or plugs including the resistance variable layers) are formed inside the via holes, respectively. Alternatively, the resistance variable layer may be deposited over the electrode layer and etched, to isolate the resistance variable layers from each other, and then the interlayer insulating layer may be deposited. That is, it is sufficient that the resistance variable layers of the resistance variable elements are formed in the isolated space of the interlayer insulating layer. The term "via hole" refers to a tubular vacant space in the interlayer insulating layer and the order in which the resistance variable element or the resistance variable layer filled therein and the interlayer insulating layer are formed may be determined as desired. In this case, the area of the resistance switching region can be made not more than the area of the upper and lower openings of the isolated space by forming the resistance variable layer such that it does not protrude from the upper and lower openings.

As shown in FIG. 7(c), the lower electrode 35a of the resistance variable element 35 may serve as the first wire 31 and the upper electrode 35c of the resistance variable element 35 may serve as the first electrode layer 33a. Thereby, the advantage similar to that of the configuration shown in FIG. 7(a) is achieved. In the configuration of FIG. 7(c), since the lower electrode 35a and the second wire (electrode) are formed as a common electrode and the upper electrode 35c and the first electrode layer 33a are formed as a common electrode, the manufacturing steps can be simplified, and the manufacturing cost can be reduced.

As described above, in accordance with the nonvolatile memory device and manufacturing method of this embodiment, since the contact area of the first electrode layer 13a of the current control element 13 which is in contact with the current control layer 13b of the current control element 13 can be made larger than the area of the resistance switching region of the resistance variable element 15, and the contact area of the first electrode layer 33a of the current control element 33 which is in contact with the current control layer 33b of the current control element 33 can be made larger than the area (plane area of a portion of the resistance variable layer 35b which is in contact with the lower electrode 35a or the plane area of a portion of the resistance variable layer 35b which is in contact with the upper electrode 35c) of the resistance switching region of the resistance variable element 35, a necessary and sufficient current can be attained to write data in a miniaturized resistance variable element, and a mass production process which is compatible with a process adapted for miniaturization which mainly uses a process rule smaller than 100 nm can be used.

Embodiment 2

Figure 3:
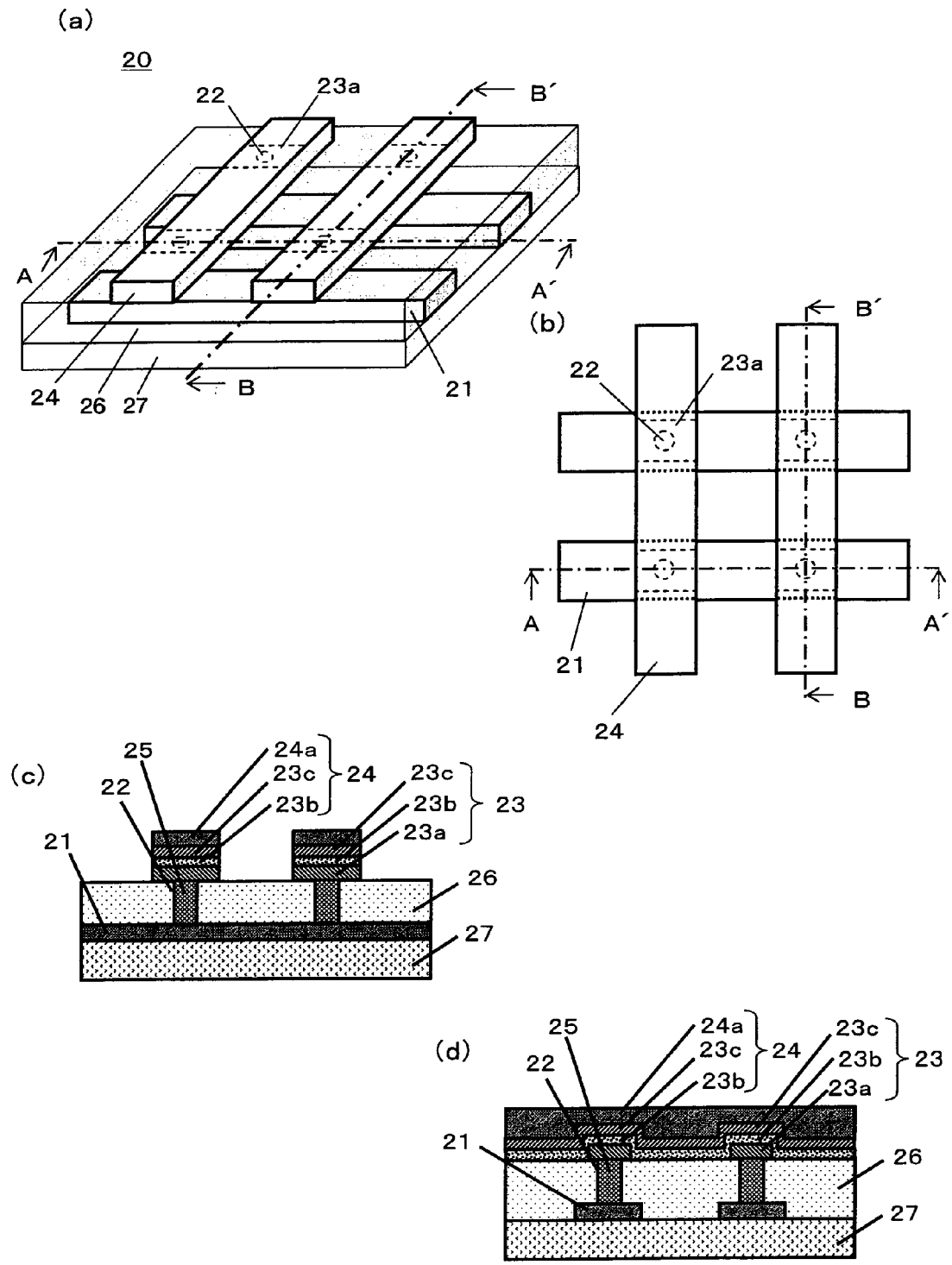
FIG. 3(a) is a perspective view schematically showing a configuration of major constituents of a nonvolatile memory device according to Embodiment 2 of the present invention.
FIG. 3(b) is a plan view schematically showing the configuration of major constituents of the nonvolatile memory device according to Embodiment 2 of the present invention.
FIG. 3(c) is a cross-sectional view taken in the direction of the arrows along line A-A' of FIGS. 3(a) and 3(b)
FIG. 3(d) is a cross-sectional view taken in the direction of the arrows along line B-B' of FIGS. 3(a) and 3(b).

FIG. 3 is a view schematically showing a configuration of major constituents of a nonvolatile memory device 20 according to Embodiment 2 of the present invention. FIG. 3(a) is a perspective view. FIG. 3(b) is a plan view. FIG. 3(c) is a cross-sectional view taken in the direction of the arrows along line A-A'. FIG. 3(d) is a cross-sectional view taken in the direction of the arrows along line B-B'.

As shown in FIG. 3, the nonvolatile memory device 20 of the present invention includes a substrate 27, first wires 21 of a stripe shape which are provided on the substrate 27, an interlayer insulating layer 26 provided over the first wires 21, second wires 24 of a stripe shape which are provided on the first wires 21 so as to three-dimensionally cross the first wires 21, respectively, via holes 22 provided at cross sections where the first wires 21 cross the second wires 24, respectively, resistance switching regions of resistance variable elements 25 disposed at least in the via holes 22, and current control elements 23 provided on the via holes 22, respectively such that a current control layer 23b is sandwiched between a first electrode layer 23a and a second electrode layer 23c. The first electrode layer 23a is disposed so as to cover the via hole 22, the current control layer 23b is disposed on the first electrode layer 23a. The second electrode layer 23c is disposed on the current control layer 23b. A wire layer 24a of the second wire 24 is disposed on the second electrode layer 23c. The second wire 24 consists of the current control layer 23b, the second electrode layer 23c and the wire layer 24a of the second wire. The width of the first electrode layer 23a is equal to the width of the second wire 24.

The first electrode layer 23a has an area of a 140 nm×160 nm square and a thickness of 20 nm, for example. The first wire 21 and the second wire 24 have a width of, for example, 160 nm. The sizes of other constituents may be identical to those of Embodiment 1.

As shown in FIGS. 3(c) and 3(d), the current control layer 23b completely covers the upper surface of the first electrode layer 23a and the side surfaces (longitudinal side surfaces when the direction in which the second wire 24 extends is expressed as the longitudinal direction) of the first electrode layer 23a. The second electrode layer 23c covers the upper surface of the current control layer 23c and a portion (longitudinal side surfaces when the direction in which the second wire 24 extends is expressed as the longitudinal direction) of the side surfaces of the current control layer 23b which portion covers the side surfaces of the first electrode layer 23a. In other words, the current control layer 23b and the second electrode layer 23c are stacked in this order only on a portion (longitudinal side surfaces when the direction in which the second wire 24 extends is expressed as the longitudinal direction) of the side surfaces of the first electrode layer 23a. When viewed from the thickness direction, the lateral end surfaces of the first electrode layer 23a, the current control layer 23b and the second electrode layer 23c are aligned with each other when the direction in which the second wire 24 extends is expressed as the longitudinal direction.

In the nonvolatile memory device 20 shown in FIG. 3, one of the first wire 21 and the second wire 24 operates as a word line and the other operates as a bit line.

Subsequently, the specific configuration of the nonvolatile memory device 20 and manufacturing method thereof of this embodiment will be described more specifically with reference to FIG. 4. Since the step of forming the via holes 22, the step for forming the resistance variable elements 25 in the via holes 22, and the preceding steps are basically the same as those of Embodiment 1, a difference will be in large part described hereinafter.

Figure 4:
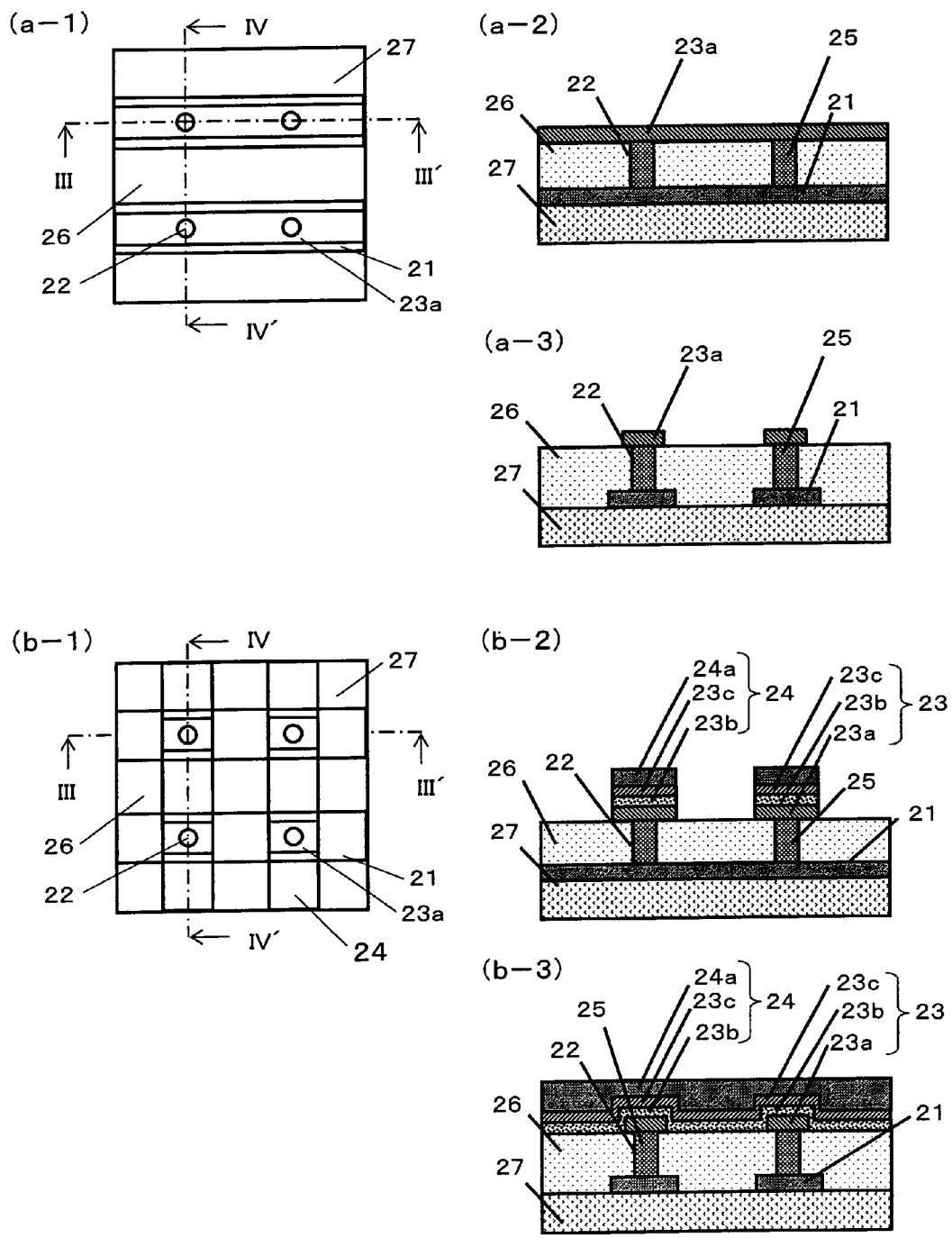
FIG. 4(a-1) is a plan view showing a step of a manufacturing method of the nonvolatile memory device according to Embodiment 2 of the present invention, FIG. 4(a-2) is a cross-sectional view taken in the direction of the arrows along line III-III' of FIG. 4(a-1), FIG. 4(a-3) is a cross-sectional view taken in the direction of the arrows along line IV-IV' of FIG. 4(a-1), FIG. 4(b-1) is a plan view showing a step of the manufacturing method of the nonvolatile memory device according to Embodiment 2 of the present invention, FIG. 4(b-2) is a cross-sectional view taken in the direction of the arrows along line III-III' of FIG. 4(b-1), and FIG. 4(b-3) is a cross-sectional view taken in the direction of the arrows along line IV-IV' of FIG. 4(b-1).

FIG. 4 is a plan view and cross-sectional view of main steps of the manufacturing method of the nonvolatile memory device 20 of this embodiment. FIG. 4(a-1) and FIG. 4(b-1) are plan views of major constituents of the nonvolatile memory device 20, and FIG. 4(a-2) and FIG. 4(b-2) are cross-sectional views taken in the direction of arrows along line III-III' along the first wire 21, and FIG. 4(a-3) and FIG. 4(b-3) are cross-sectional views taken in the direction of the arrows along line IV-IV' along the second wire 24. In an actual nonvolatile memory device 20, a number of first wires 21 and a number of second wires 24 are formed and a number of via holes 22 are provided at cross sections where the first electrode wires 21 cross the second wires 24, respectively. In the example shown in FIG. 4, two first wires 21 and two second wires 24 are formed. For easier illustration, a part of the shapes are drawn as enlarged.

The steps for forming the resistance variable elements 25 in the via holes 22 and the preceding steps are identical to those of Embodiment 1. After forming the resistance variable elements 25, the first electrode layer 23a is deposited over the via holes 22 and the entire surface of the interlayer insulating layer 26 and etched in stripe-shaped wire pattern having a larger width than the via holes and a smaller width than the first wires 21 and extending in the same direction that the first wire 21 extends, thereby forming the first electrode layers 23a, as shown in FIG. 4(a-1) and FIG. 4(a-2), and FIG. 4(a-3). After forming the first electrode layers 23a, the current control layers 23b, the second electrode layers 23c and the wire layers 24a of the second wires are sequentially deposited on the upper surface of the first electrode layers 23a and the upper surface of the interlayer insulating layer 26. As shown in FIG. 4(b-1), FIG. 4(b-2), and FIG. 4(b-3), the portion of the first electrode layers 23a remaining unetched, the current control layers 23b, the second electrode layers 23c and the wire layers 24a of the second wires are etched together in a predetermined pattern, thereby forming the second wires 24.

By sequentially depositing the layers and etching the layers together, the current control layer 23b is formed so as to cover the upper surface of the first electrode layer 23a and the side surfaces (longitudinal side surfaces when the direction in which the second wire 24 extends is expressed as a longitudinal direction) of the first electrode layer 23a. The second electrode layer 23c is formed so as to cover the upper surface of the current control layer 23b and the portion (longitudinal side surfaces when the direction in which the second wire 24 extends is expressed as a longitudinal direction) of the side surfaces of the current control layer 23b which portion covers the side surfaces of the first electrode layer 23a. In other words, the current control layer 23b and the second electrode layer 23c are stacked in this order only on a portion (longitudinal side surfaces when the direction in which the second wire 24 extends is expressed as the longitudinal direction) of the side surfaces of the first electrode layer 23a. When viewed from the thickness direction, the lateral end surfaces of the first electrode layer 23a, the current control layer 23b and the second electrode layer 23c are aligned with each other when the direction in which the second wire 24 extends is expressed as the longitudinal direction.

The shape of the resistance variable element and the shape of the current control element in the nonvolatile memory device manufactured are basically the same as those of Embodiment 1, and the first electrode layers 23a are formed using a stripe-shaped wire pattern having a width of 140 nm and extending in the same direction that the first wire 21 extends and the second wires 24a are formed using a wire pattern having a width of 160 nm, for example. In this case, the first electrode layer 33a shown in FIG. 7(a), FIG. 7(b) and FIG. 7(c) has a width of 160 nm when viewed in the directions of the arrows along line III-III' of FIG. 4(b-1), and has a width of 140 nm when viewed in the directions of the arrows along line IV-IV' in FIG. 4(b-1). Therefore, the area (hereinafter referred to as second area) of the first electrode layer 33a which is in contact with the current control layer 33b is 0.0224 µm². Since diameter 101 of the via hole 32 is 80 nm, the area (hereinafter referred to as first area) of the resistance switching region is a plane area of a portion of the resistance variable layer 35b which is in contact with the lower electrode 35a or a plane area of a portion of the resistance variable layer 35b which is in contact with the upper electrode 35c, and therefore is 0.0050 µm². Since the ratio of the second area to the first area is about 4.4, the current control element 33 such as the MIM diode which would be broken down with a current density of 1 mA/µm² can apply a necessary and sufficient write current to the resistance variable element 35, when a write current must be applied to the resistance variable element 35 with a current density of 3 mA/µm².

In view of the area of the side surface, when the thickness 103 of the first electrode layer 33a is 20 nm, the second area is 0.0288 µm². The ratio of the second area to the first area (second area/first area) is about 5.7. From this, it should be understood that the current control element of an identical upper limit of current density can apply a higher current to the resistance variable element disposed in the plug section.

As should be clearly understood from the above, in the nonvolatile memory device of this embodiment, the first electrode layer is initially formed using a line-shaped pattern rather than a dot-shaped pattern. In general, miniaturized structure is easily formed using the line-shaped pattern (etching for forming the miniaturized structure is easily conducted). For this reason, the configuration of this embodiment is more suitable for further miniaturization than the configuration of Embodiment 1. In accordance with the configuration of this embodiment, a necessary and sufficient current can be attained to write data in a miniaturized resistance variable element, and a mass production process which is compatible with a process adapted for miniaturization which mainly uses a process rule smaller than 100 nm can be used.

If the lower electrode 35a of the resistance variable element 35 serves as the first wire 31 and the upper electrode 35c of the resistance variable element 35 and the first electrode layer 33a are formed as a common electrode as shown in FIG. 7(c), the same advantage as that described above can be achieved, because the aforesaid first area and second area are equal to those described above. In addition, since the electrodes are formed as a common electrode, the manufacturing steps can be simplified and the manufacturing cost can be reduced.

As should be appreciated from the above, in the nonvolatile memory device and manufacturing method thereof of Embodiment 2, the first area of the current control element 23 and the first area of the current control element 33 can be made larger than the resistance switching region (second area) of the resistance variable element 25 and the resistance switching region (second area) of the resistance variable element 35, and a necessary and sufficient current can be attained to write data in a miniaturized resistance variable element. In addition, a mass production process which is compatible with a process adapted for miniaturization which mainly uses a process rule smaller than 100 nm can be used.

Embodiment 3

Figure 5:
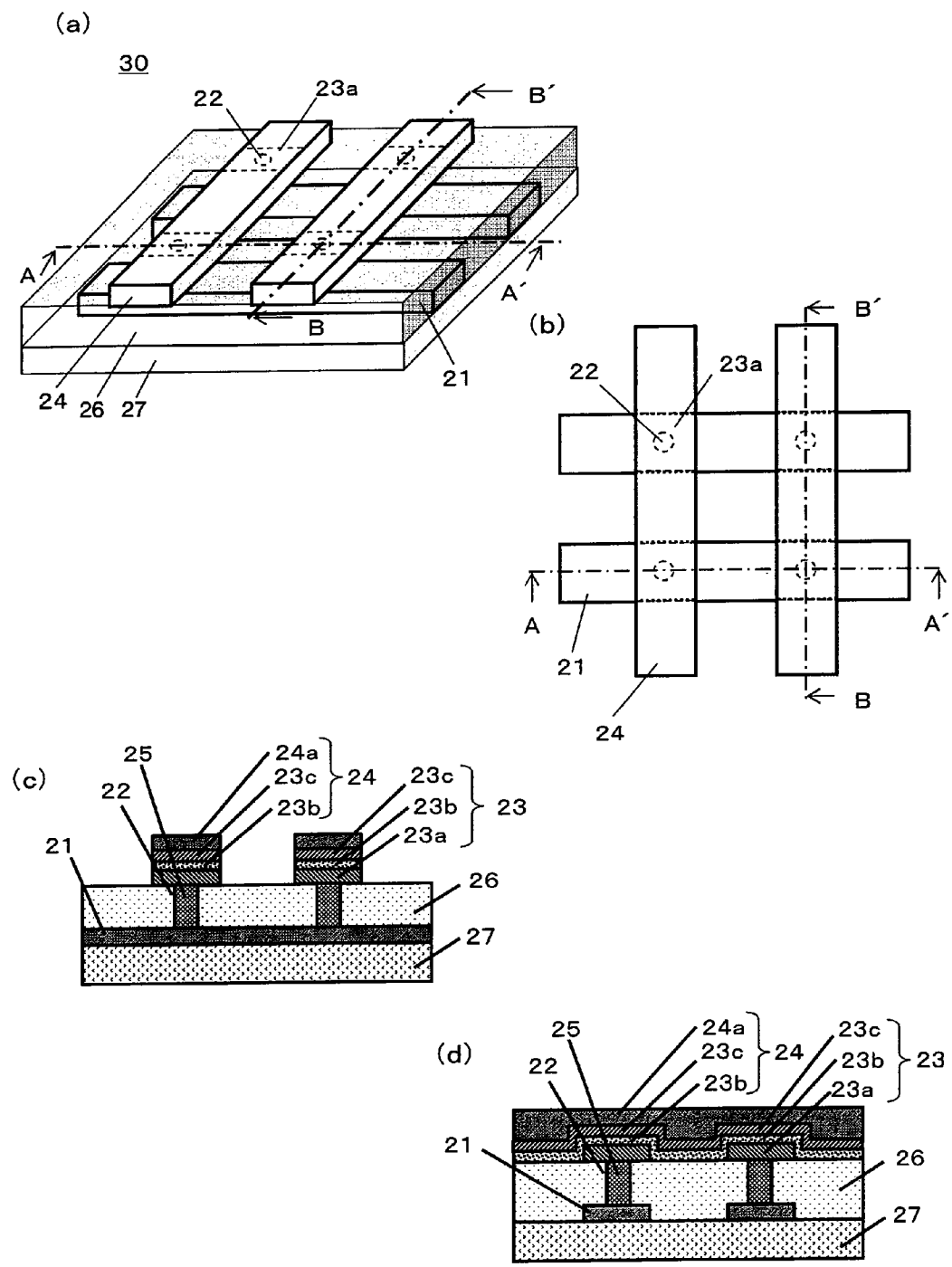
FIG. 5(a) is a perspective view schematically showing a configuration of major constituents of a nonvolatile memory device according to Embodiment 3 of the present invention.
FIG. 5(b) is a plan view schematically showing a configuration of the major constituents of the nonvolatile memory device according to Embodiment 3 of the present invention.
FIG. 5(c) is a cross-sectional view taken in the direction of the arrows along line A-A' of FIGS. 5(a) and 5(b)
FIG. 5(d) is a cross-sectional view taken in the direction of the arrows along line B-B' of FIGS. 5(a) and 5(b).

FIG. 5 is a view schematically showing a configuration of major constituents of a nonvolatile memory device 30 according to Embodiment 3 of the present invention. FIG. 5(a) is a perspective view. FIG. 5(b) is a plan view. FIG. 5(c) is a cross-sectional view taken in the direction of the arrows along line A-A'. FIG. 5(d) is a cross-sectional view taken in the direction of the arrows along line B-B'.

As shown in FIG. 5(d), in the nonvolatile memory device 30 of this embodiment, the first electrode layer 23a has a width equal to the width of the first wire layer. Since the other constituents of the nonvolatile memory device 30 are identical to those of the nonvolatile memory device 20 of Embodiment 2, they are identified by the same reference numerals and will not be described repetitively.

The first electrode layer 23a has an area of a 160 nm×160 nm square and a thickness of 20 nm, for example. The first wire 21 and the second wire 24 have a width of, for example, 160 nm. The sizes of other constituents may be equal to those of Embodiment 1.

The manufacturing method of the nonvolatile memory device 30 having the above described shape is equal to that of the above described nonvolatile memory device 20 except for the following respects.

Figure 6:
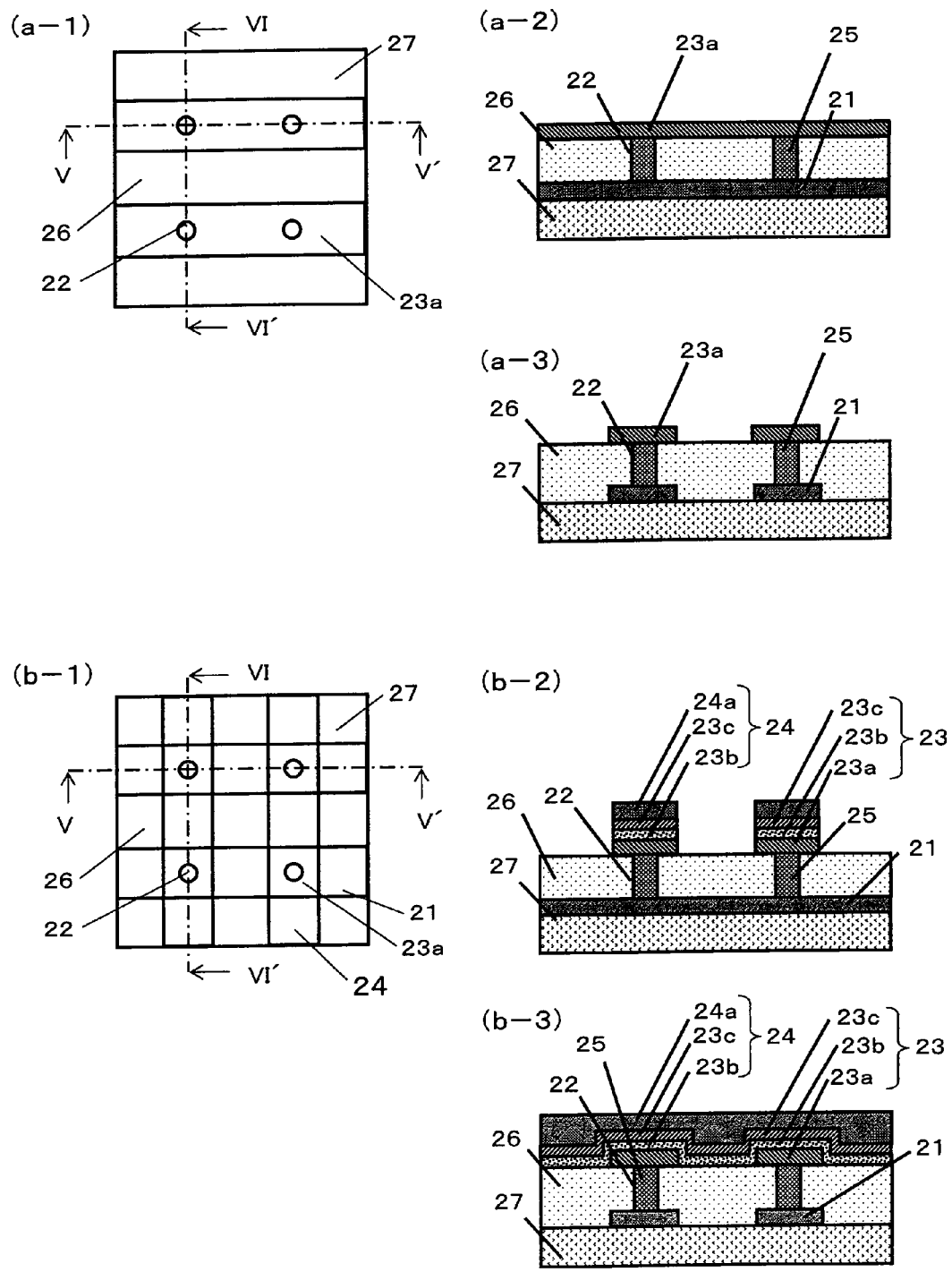
FIG. 6(a-1) is a plan view showing a step of a manufacturing method of a nonvolatile memory device according to Embodiment 3 of the present invention, FIG. 6(a-2) is a cross-sectional view taken in the direction of the arrows along line V-V' of FIG. 6(a-1), and FIG. 6(a-3) is a cross-sectional view taken in the direction of the arrows along line VI-VI' of FIG. 6(a-1), FIG. 6(b-1) is a plan view showing a step of the manufacturing method of the nonvolatile memory device according to Embodiment 3 of the present invention, FIG. 6(b-2) is a cross-sectional view taken in the direction of the arrows along line V-V' of FIG. 6(b-1), and FIG. 6(b-3) is a cross-sectional view taken in the direction of the arrows along line VI-VI' of FIG. 6(b-1).

FIG. 6 is a plan view and a cross-sectional view of main steps of the manufacturing method of the nonvolatile memory device 30 of this embodiment. FIG. 6(a-1) and FIG. 6(b-1) are plan views of major constituents of the nonvolatile memory device 30, and FIG. 6(a-2) and FIG. 6(b-2) are cross-sectional views taken in the direction of the arrows along line V-V' along the first wire 21, and FIG. 6(a-3) and FIG. 6(b-3) are cross-sectional views taken in the direction of the arrows along line VI-VI' along the second wire 24. The manufacturing method of the nonvolatile memory device 30 is different from the manufacturing method of the nonvolatile memory device 20 of Embodiment 2 in that, in the steps shown in FIGS. 6(a-1), 6(a-2), and 6(a-3), after the first electrode layer 23a is deposited over the via holes 22 and the interlayer insulating layer 26, it is etched in the same wire pattern as that of the first wires 21, using the mask pattern of the first wires 21. In this case, when the width of the first wires 21 is 160 nm and the width of the second wires 24 is 160 nm, the area (hereinafter referred to as second area) of the first electrode later 23a which is in contact with the current control layer 23b is 0.0256 μm². Since diameter 101 of the via hole 32 is 80 nm in the example shown in FIG. 7, the area (first area) of the resistance switching region is a plane area of a portion of the resistance variable layer 35b which is in contact with the lower electrode 35a or a plane area of a portion of the resistance variable layer 35b which is in contact with the upper electrode 35c, and therefore is 0.0050 μm². Therefore, in the configuration of this embodiment, the current control element 33 such as the MIM diode which would be broken down with a current density of 1 mA/μm² can apply a necessary and sufficient write current to the resistance variable element 35, when the write current must be applied to the resistance variable element 35 with a current density of 3 mA/μm², for example. In addition, since a common mask pattern can be used to form the first wires 21 and the first electrode layers 23a, the manufacturing cost can be reduced.

In view of the area of the side surfaces, when the first electrode layer 13a is 20 nm, the second area is 0.0320 μm². The ratio of the second area to the first area (second area/first area) is about 6.4. From this, it should be understood that the current control element of an identical upper limit of current density can apply a higher current to the resistance variable element disposed in the plug section.

As should be appreciated from the above, in the nonvolatile memory device and manufacturing method thereof according to Embodiment 3, the first area of the current control element 23 and the first area of the current control element 33 can be made larger than the area (second area) of the resistance switching region of the resistance variable element 25 and the resistance switching region of the resistance variable element 35, respectively. Therefore, a necessary and sufficient current can be attained to write data in the miniaturized resistance variable element. Furthermore, a mass production process which is compatible with a process adapted for miniaturization which manly uses a process rule smaller than 100 nm can be used.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

In a nonvolatile memory device of the present invention, a material which reversibly switches a resistance value in response to a voltage or current applied thereto is used. By making a current control element larger in size than a resistance variable element, a nonvolatile memory device which is capable of stable operation and has a high density and a large capacity is achieved, and thus, the nonvolatile memory device of the present invention is useful in a variety of electronic hardware fields such as personal computers, cell phones, etc, incorporating the nonvolatile memory device.

The invention claimed is:
1. A nonvolatile memory device comprising:
a substrate;
a plurality of first wires provided on the substrate so as to extend in parallel with each other in a first direction;

an interlayer insulating layer provided over the substrate and the plurality of first wires;

a plurality of via holes penetrating the interlayer insulating layer, each of said plurality of via holes exposing a respective one of said plurality of the first wires;

a plurality of resistance variable layers, one of which is provided in each of said plurality of via holes, which are provided under upper openings of the via holes, respectively, each of said plurality of resistance variable layers being electrically connected to one of the plurality of first wires, respectively;

a plurality of first electrode layers, each of which is electrically connected to one of the plurality of the resistance variable layers, respectively such that each of the plurality of first electrode layers covers an entire upper opening of associated one of the plurality of via holes and protrudes outwardly over an entire periphery of the upper opening; and a plurality of second wires provided so as to extend in parallel with each other in a second direction crossing the first direction when viewed from a thickness direction of the interlayer insulating layer such that each of the plurality of second wires covers an upper surface and side surfaces of associated one of the first electrode layers;

wherein each of the second wires includes: a current control layer provided so as to cover an upper surface and side surfaces of the plurality of first electrode layers; and a second electrode layer provided so as to cover an upper surface of the current control layer and a portion of side surfaces of the current control layer, the said portion covering the side surfaces of the plurality of first electrode layers.

2. The nonvolatile memory device of claim 1, wherein an area of a lower surface of a given one of said plurality of first electrode layers is larger than an area of the upper opening of the corresponding one of said plurality of via holes.

3. The nonvolatile memory device of claim 1, wherein an area of a resistance switching region of each of said plurality of resistance variable layers is equal to or less than an opening area of each of the corresponding one of the plurality of via holes.

4. The nonvolatile memory device of claim 1, wherein each of said plurality of resistance variable layers comprises a bipolar resistance variable element.

5. A nonvolatile memory device comprising:
a substrate;
a plurality of first wires having a stripe shape which are provided on the substrate;
an interlayer insulating layer provided over the plurality of first wires;
a plurality of second wires having a stripe shape which are provided so as to three-dimensionally cross the plurality of first wires, respectively;
a plurality of plugs provided at cross sections where the plurality of first wires cross the plurality of second wires, respectively; and
a plurality of current control elements provided on the plurality of plugs, respectively, and each of said plurality of current control elements including a current control layer, a first electrode layer, and a second electrode layer, the current control layer being disposed sandwiched between the first electrode layer and the second electrode layer;
wherein each of said plurality of the plugs includes a resistance variable element, respectively;
wherein the first electrode layer is disposed so as to cover associated one of said plurality of the plugs;
wherein in each of said plurality of current control elements, the current control layer, the second electrode layer and a wire layer are stacked in this order on the first electrode layer;
wherein each of the plurality of second wires of the stripe shape has a stack structure including the current control layer, the second electrode layer and the wire layer; and
wherein the current control layer is provided so as to cover an upper surface of the first electrode layer and at least a part of side surfaces of the first electrode layer.

6. The nonvolatile memory device of claim 5, wherein an area of a lower surface of a given one of said plurality of first electrode layers is larger than an area of the upper end surface of the corresponding one of said plurality of plugs.

7. The nonvolatile memory device of claim 5, wherein an area of a resistance switching region of each of said plurality of resistance variable elements is equal to or less than an area of end surface of each of the corresponding one of the plurality of plugs.

8. The nonvolatile memory device of claim 5, wherein each of said plurality of resistance variable elements comprises a bipolar resistance variable element.

9. A nonvolatile memory device according to claim 5:
wherein the first electrode layer has a width equal to a width of the second wire.

10. The nonvolatile memory device according to claim 5, wherein the resistance variable element is a resistance variable layer sandwiched between a lower electrode and an upper electrode; and
wherein an area of the first electrode layer which is in contact with the current control layer is larger than an area of a portion of the resistance variable layer which is in contact with the lower electrode or an area of a portion of the resistance variable layer which is in contact with the upper electrode.

11. The nonvolatile memory device according to claim 10, wherein the upper electrode and the first electrode layer are a common electrode.

* * * * *